(12) United States Patent
Ball et al.

(10) Patent No.: US 7,563,999 B2
(45) Date of Patent: Jul. 21, 2009

(54) FRONT CONNECTED TEST SWITCH

(75) Inventors: Roy Ball, Coral Springs, FL (US); Todd Alan Gentile, Tamarac, FL (US); Timothy Frankland Masters, Boca Raton, FL (US)

(73) Assignee: ABB Technology Ag, Zurich (CH)

( * ) Notice: Subject to any disclaimer, the term of this patent is extended or adjusted under 35 U.S.C. 154(b) by 366 days.

(21) Appl. No.: 11/724,064

(22) Filed: Mar. 14, 2007

(65) Prior Publication Data

US 2008/0011589 A1    Jan. 17, 2008

Related U.S. Application Data

(60) Provisional application No. 60/782,136, filed on Mar. 14, 2006.

(51) Int. Cl.
*H01H 9/00* (2006.01)
(52) U.S. Cl. ........................ 200/293; 324/141; 324/142; 324/754; 361/724; 361/727
(58) Field of Classification Search ................... 29/622, 29/593, 842; 307/64; 324/141, 142, 754; 200/18, 193–297, 303
See application file for complete search history.

(56) References Cited

U.S. PATENT DOCUMENTS

| 5,870,278 | A * | 2/1999 | Girard et al. ................. 361/627 |
| 6,452,785 | B1 * | 9/2002 | Kaaden et al. .............. 361/622 |
| 7,271,357 | B2 * | 9/2007 | Ostmeier .................. 200/51.09 |
| 7,302,752 | B2 * | 12/2007 | Ball ............................. 29/622 |
| 7,372,692 | B2 * | 5/2008 | Ranta et al. ................. 361/641 |
| 7,388,169 | B2 * | 6/2008 | Azzola et al. ............... 218/155 |
| 7,479,029 | B2 * | 1/2009 | Cook et al. .................. 439/517 |

* cited by examiner

*Primary Examiner*—Michael A Friedhofer
(74) *Attorney, Agent, or Firm*—Paul R. Katterle

(57) ABSTRACT

A test switch is provided having front and rear sides. The test switch includes a base to which a plurality of switch units are mounted. A row of upper terminals are removably mounted to the base, above the switch units, and a row of lower terminals are removably mounted to the base below the switch units. The upper and lower terminals are adapted for connection to wiring from the front side of the test switch. Upper and lower covers are releasably attached to the base and extend across the rows of upper and lower terminals, respectively.

10 Claims, 7 Drawing Sheets

FRONT CONNECTED TEST SWITCH

CROSS-REFERENCE TO RELATED APPLICATION

This application claims the benefit of U.S. provisional patent application No. 60/782,136 filed on Mar. 14, 2006, which is hereby incorporated by reference in its entirety.

BACKGROUND OF THE INVENTION

The present invention is directed toward switches and more particularly toward test switches.

Relays are commonly used in electric utility applications to detect various possible problems in the electrical power output and, thus, protect very expensive equipment such as motors and generators. These protective relays are used in relay systems which also include circuit breakers. Relays and circuit breakers must function together because the primary function of the relays is to trip the circuit breakers.

Protective relays constantly monitor the power systems to assure maximum continuity of electrical service with minimum damage to life and property. Protective relays are used in applications extending from the generation and transmission of power, through the distribution and utilization of the power. Examples of such applications include, without limitation, motor, generator, transformer, station-bus, line and circuit, system ground, network systems, pilot wire, pilot channel, transmission line, pilot relying, backup, reclosing, synchronizing and load-shedding. In general, current transformers and potential transformers are employed in high current and high potential applications.

The transformers reduce the magnitude of the current or voltage, which is then fed to the relays, meters and instruments at a much lower level for detection. The relay terminals are then connected to a test switch terminal or poles. Each test switch can be associated with one or more relays. It is necessary to short circuit the line and load terminals when the relay is removed from its case or the adjacent test switch is opened. The test switch provides this necessary short circuit or bypass feature. If this short circuit does not occur there could be significant damage to the associated current transformer as well as a safety hazard to nearby personnel.

One example of a prior art test switch is the Flexitest™ test switch 10 shown in FIG. 1*a* which is sold by ABB Inc. of Coral Springs, Fla. The variety and extensive types of test switches available allows for many types of applications. As is well known to those of ordinary skill in the art these applications include but are not limited to a test switch with all potential switches, that is, no switches associated with current transformers, or all of the switches in a test switch associated with current transformers.

Test switch 10 includes on its front face 10 switches 12*a* to 12*j* arranged in five (5) sets. In the embodiment shown in FIG. 1*a*, the test switch 10 has three (3) sets of switches, namely 12*a* and 12*b*, 12*c* and 12*d*, and 12*e* and 12*f* which are associated with a respective one of three (3) current transformers (not shown). As is well known, each current transformer is associated with a respective one of the three (3) phases of a three phase power source. Test switch 10 also includes four potential switches 12*g*, 12*h*, 12*i* and 12*j*, with one of the four switches associated with phase A of the three phase source, a second of the four switches associated with phase B of the three phase source, a third of the four switches associated with phase C of the three phase source and the fourth switch associated with the neutral of the three phase power source.

One example of the three sets of switches associated with a current transformer are shown in FIG. 1*b*. The two switches in each of the three sets of switches associated with a current transformer include a switch such as switch 12*a*, 12*c* or 12*e* which has a shorting blade 14 and a switch such as switch 12*b*, 12*d* or 12*f* which does not have a shorting blade. The switch 12*a*, 12*c* or 12*e* with the shorting blade provides when opened the desired short circuit of the line and load terminals when that switch is opened. The switch 12*b*, 12*d* or 12*f* without the shorting blade provides a current test jack 16.

Test switch 10 also includes on it rear face twenty terminals only ten of which 18*a* to 18*j* are shown in FIG. 1*a* for connection to the relays associated with the current transformers and the three phases and neutral of the three phase source. When test switch 10 is mounted in a switchboard panel (not shown) the switches 12*a* to 12*j* are accessible from the front of the panel, while the terminals 18*a* to 18*j* and the other ten rear face terminals not shown in FIG. 1*a* are accessible only from the rear of the panel.

Although prior art test switches, such as the test switch 10, have proven to be an effective means of implementing connections to all types of relays, meters and instruments, such switches are not without their drawbacks. Typically, the terminals (such as 18*a* to 18*j*) are only accessible from the rear of the test switch. Moreover, only one type of terminal connection is provided, namely either a stud connection, or a nut connection.

Based on the foregoing, there exists a need in the art for a test switch having terminals that are accessible from the front of the test switch and have different types of terminal connections. The present invention is directed to such a test switch.

SUMMARY OF THE INVENTION

In accordance with the present invention, a test switch is provided having front and rear sides. The test switch includes a base having a row of spaced-apart upper barrier walls, a row of spaced-apart lower barrier walls and a row of spaced-apart main barrier walls disposed between the row of upper barrier walls and the row of lower barrier walls. A plurality of switch units are mounted to the base. Each switch unit is disposed between a pair of the main barrier walls and has a handle. A plurality of upper terminals and a plurality of lower terminals are removably mounted to the base. Each upper terminal is disposed between a pair of the upper barrier walls and is connected to one of the switch units. Each lower terminal is disposed between a pair of the lower barrier walls and is connected to one of the switch units. The upper and lower terminals are adapted for connection to wiring from the front side of the test switch. A main cover is mounted to base and is disposed over the handles of the switch units.

In one embodiment of the present invention, upper and lower covers are mounted to the base. The upper cover extends across the row of upper barrier walls, while the lower cover extends across the row of lower barrier walls. The upper, main and lower covers are disposed on the front side of the test switch.

In another embodiment of the present invention, at least one of the upper and lower terminals includes a nut threadably secured to a stud, and at least another one of the upper and lower terminals includes a screw threadably disposed in an opening of a post.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1A:
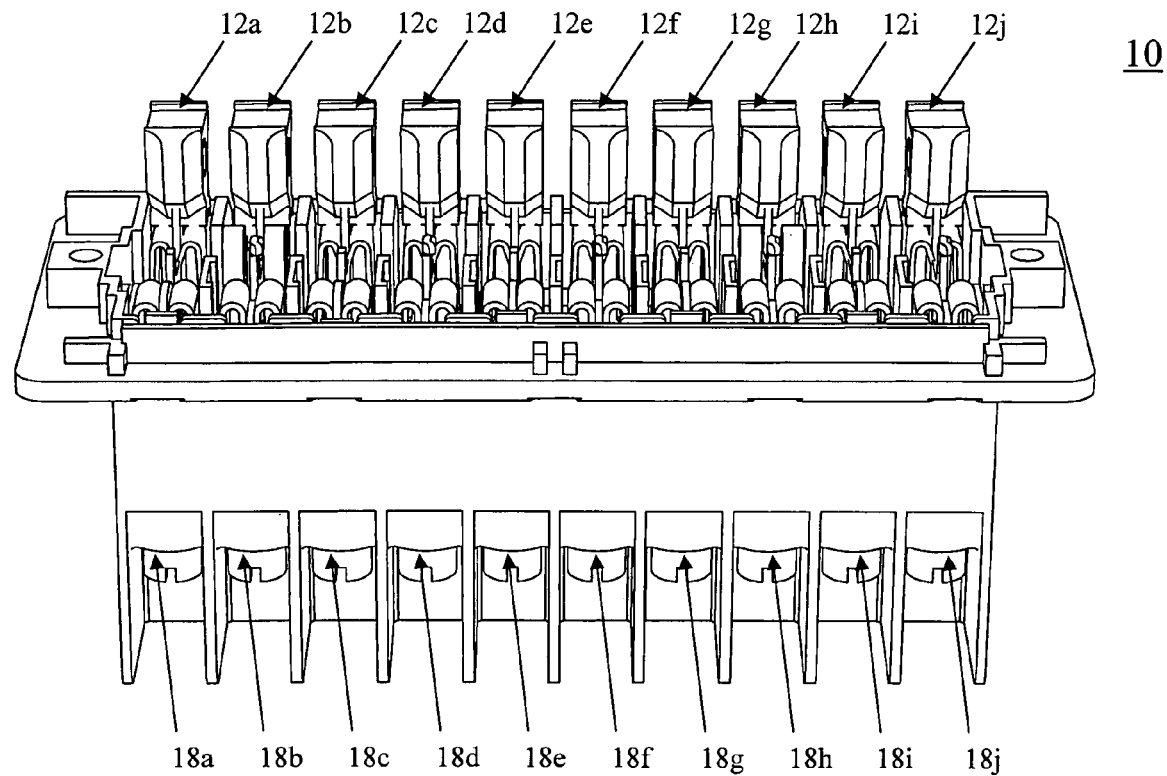
FIG. 1a shows a prior art test switch.
Figure 1B:
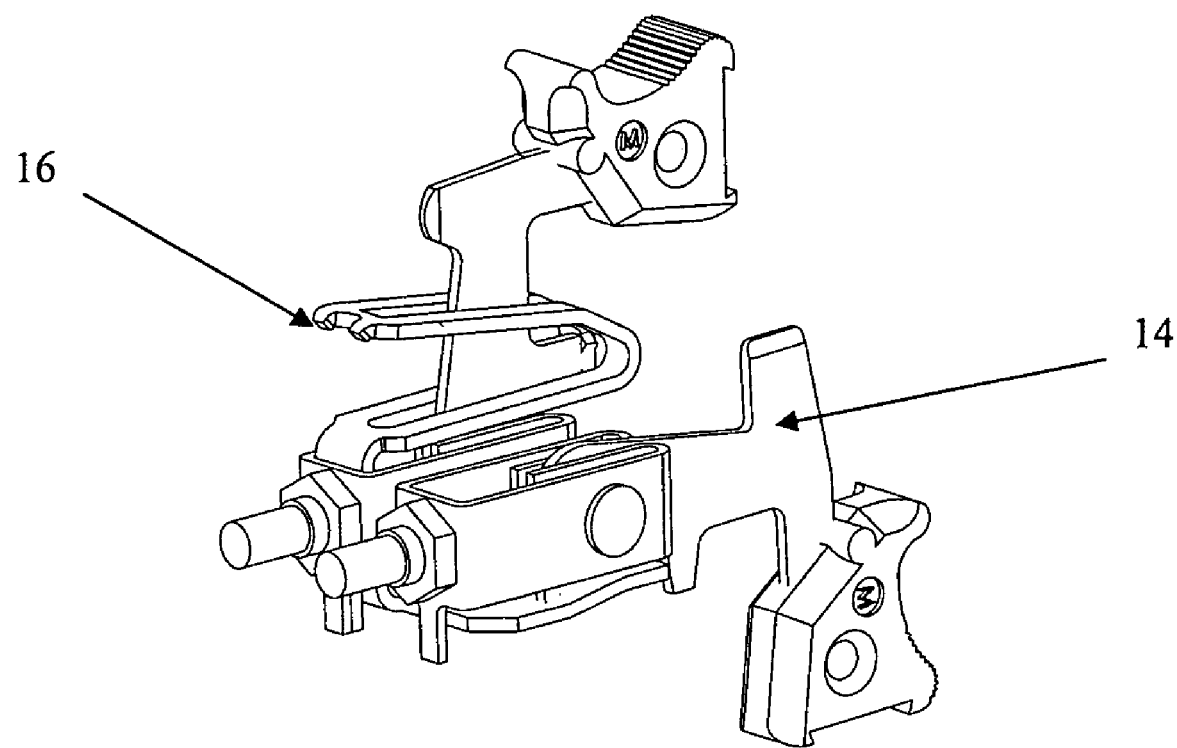
FIG. 1b shows an example of a set of switches in the prior art test switch that is associated with a current transformer.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Figure 2:
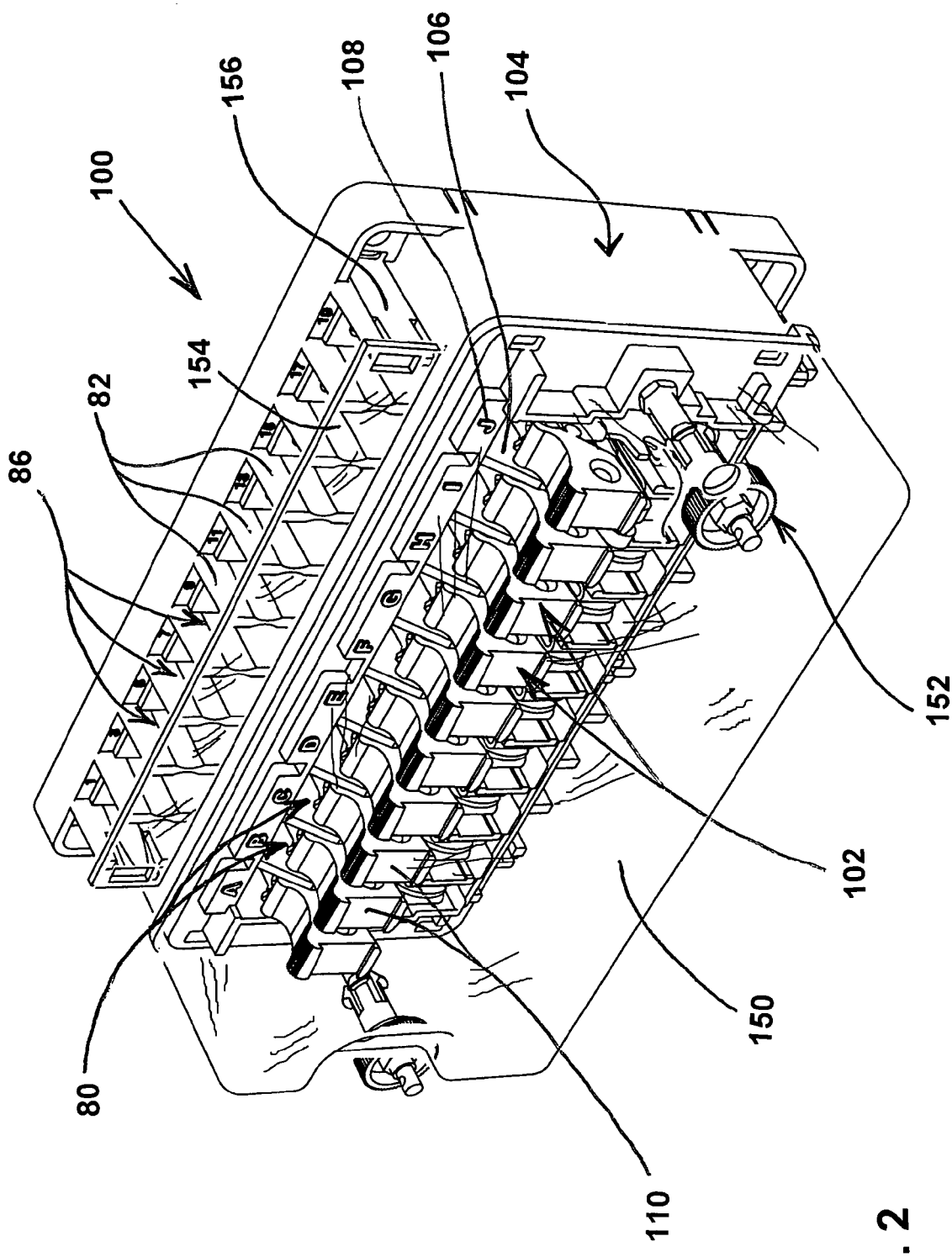
FIG. 2 is a front perspective view of a test switch embodied in accordance with the present invention.

Referring now to FIG. 2, the present invention is directed to a test switch 100 adapted for flush mounting on the front of a switchboard panel in order to facilitate inspection and accessibility. The test switch 100 is secured a switchboard panel with four sets of nuts and lock washers connected to the rear of the switchboard panel. The test switch 100 is rated at 600 volts and 30 amps and exceeds all the requirements of ANSI/IEE Standards C37.90.

Figure 5:
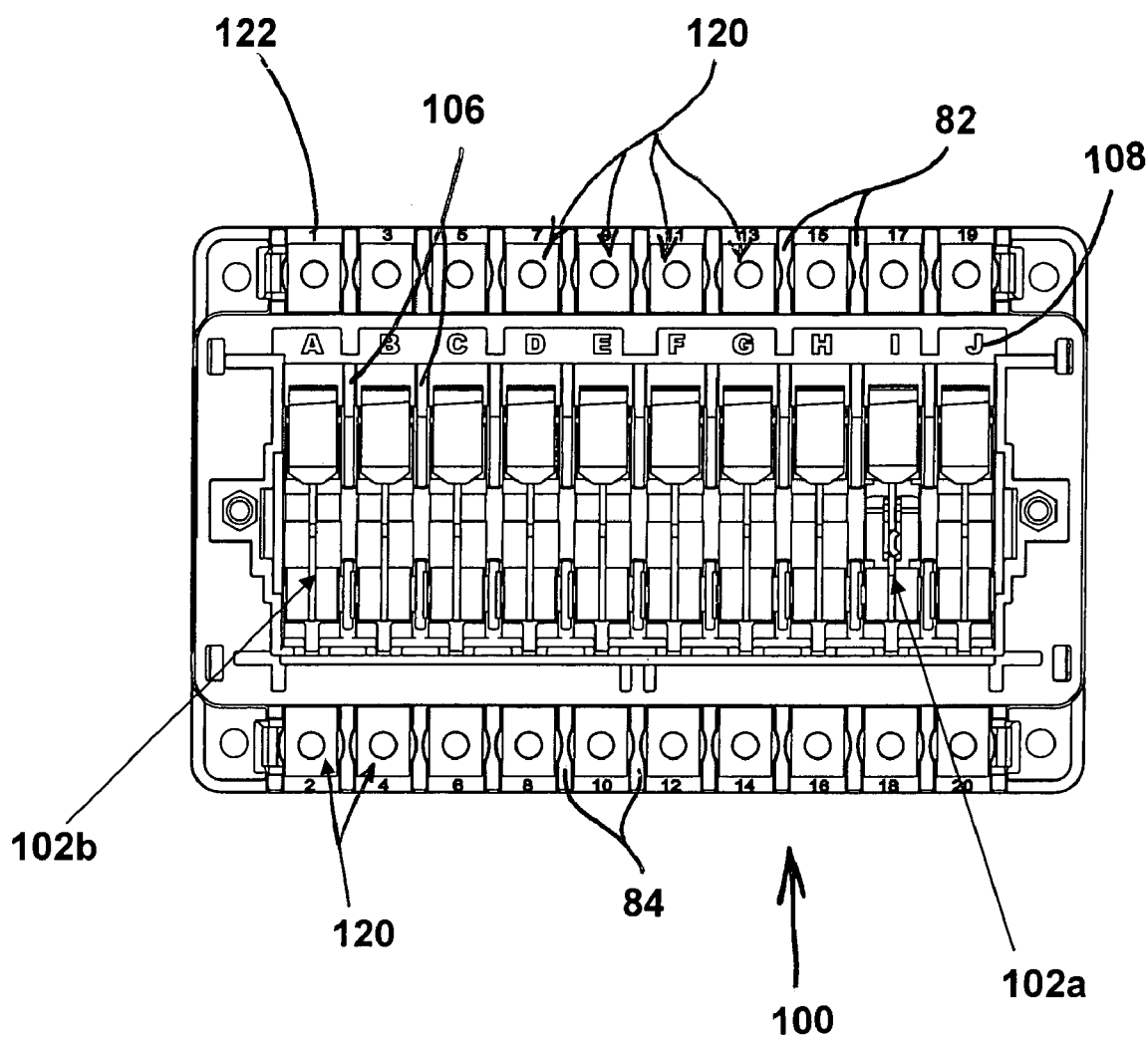
FIG. 5 is a front plan view of the test switch of the present invention.

The test switch 100 includes a plurality of poles or switch units 102 mounted to a base 104 comprised of a molded polycarbonate/ABS blended material. The base 104 has a plurality of laterally spaced apart barriers 106 that help form a plurality of main compartments 80. The switch units 102 are disposed in the main compartments 80, respectively, and are separated from each other by the barriers 106. In one embodiment, the test switch 100 can have from one to ten switch units 102. The switch units 102 can be assembled in a variety of different arrangements, to match a customer's requirements. A test clip 170 (shown in FIG. 6) on top of each switch unit 102 permits a voltage measurement to be made directly on each switch unit 102 without disturbing the existing connections. The test clips 170 are adapted for connection to standard spring test clip leads. The switch units 102 are identified by markings 108, such as letters A to J, which are visible along a top of the base 104 from left to right. Each switch unit 102 is a knife-blade type switch and can either be a potential pole, or a current pole. A potential pole switch unit 102a and a current pole switch unit 102b are shown in FIG. 5. Potential pole switch units 102a are configured as single, non-shorting knife blades for use in potential, trip, or control circuits. Current pole switch units 102b are configured in sets of two, (C-C), for use with current circuits, and comprise a current test jack, a shorting spring, a shorting blade, and a non-shorting blade. The switch units 102 are releasably connected to the base 104 by a lock washer 103 and nut 105.

Figure 6:
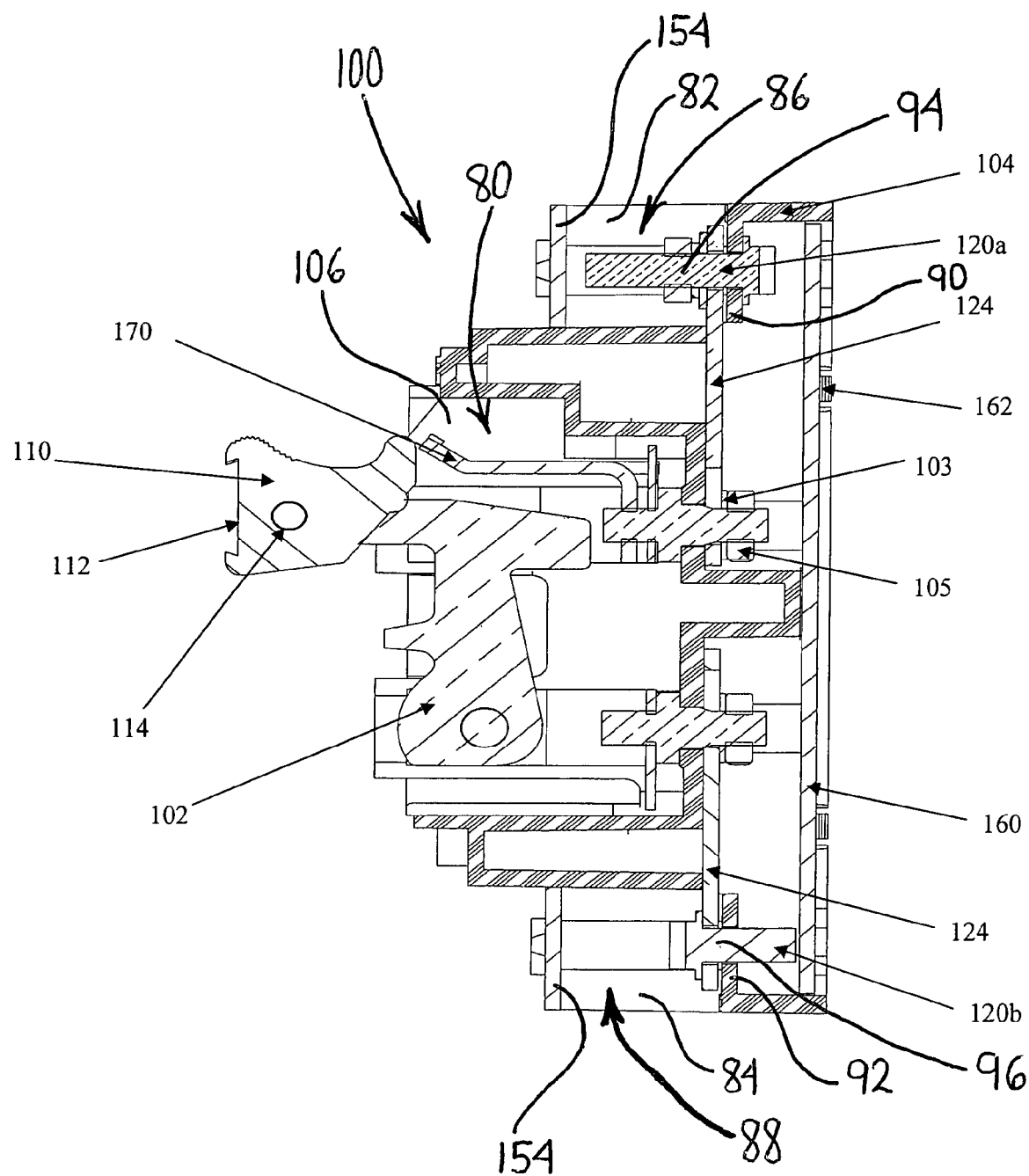
FIG. 6 is a cross-sectional view of the test switch of the present invention.

Referring now also to FIG. 6, each switch unit 102 has a handle 110 comprised of a molded thermoplastic material. The handles 110 for potential pole switch units 102a can have a different color than the handles 110 for current pole switch units 102b. For example, the handles 110 for potential pole switch units 102a can be black, while the handles 110 for current pole switch units 102b can be red. Each handle 110 has a dovetail indentation 112 to hold a circuit identification label. In addition, each handle 110 has a hole 114 through which a horizontally-extending interlocking bar (not shown) may be inserted. The switch units 102 can be operated independently, or ganged together with one or more interlocking bars to suit testing needs. Interlocking bars can, for example, mechanically tie two, three, four, five, six, or ten handles 110 together.

The base 104 also has a plurality of laterally spaced-apart upper barriers 82 disposed above the barriers 106 and a plurality of laterally spaced-apart lower barriers 84 disposed below the barriers 106. The upper barriers 82, an upper rear wall 90 of the base 104 and a cover 154 form a row of upper compartments 86 disposed above the main compartments 80. The lower barriers 84, a lower rear wall 92 of the base 104 and another cover 154 form a row of lower compartments 88 disposed below the main compartments 80. The upper compartments 86 have top openings, while the lower compartments 88 have bottom openings. Connection terminals 120 are disposed in the upper compartments 86, respectively, and connection terminals 120 are disposed in the lower compartments 88, respectively. The connection terminals 120 are located at the front of the test switch 100, adjacent to the switch units 102, and are adapted for connection to wiring from the front side of the test switch 100. The connection terminals 120 are convenient for providing connections to relays, meters and instruments that are wired on the same side of the panel where the test switch 100 is located. The connection terminals 120 are identified with markings 122, such as numbers one to twenty, for easy identification. Each pair of connection terminals 120 is associated with a corresponding switch unit 102 designated by a marking 108 on the front of the switch unit 102. More specifically, a connection terminal 120 in an upper compartment 86 and a connection terminal 120 in an aligned lower compartment 88 are connected to each switch unit 102. Thus, by way of example and with reference to FIG. 5, the switch unit 102 designated with the letter "A" is connected to the connection terminal 120 designated with the number "1" and the connection terminal 120 designated with the number "2". Each connection terminal 120 extends through a hole in the rear wall 90 or 92 and is connected to its associated switch unit 102 by a nickel plated brass bar 124. Each connection terminal 120 may be a stud-type connection terminal 120a or a nut-type connection terminal 120b. A stud-type connection terminal 120a has a threaded stud 94 over which a ring or fork type wire termination may be disposed and secured with a nut and washer. A nut-type connection terminal 120b has a post 96 with a threaded hole formed therein. A ring or fork type wire termination is oriented over the hole in the post 96. A screw is disposed through the ring or fork and is threaded into the hole. Each connection terminal 120 is removably mounted to the base 104. For example, the studs 94 may be threadably engaged with the holes in the upper rear wall 90 and the posts 96 may be threadably engaged with the holes in the lower rear wall 92. In this manner, different types of connections terminals 120 (e.g. 120a or 120b) may be selectively mounted in the test switch 100.

The test switch 100 has a removable main cover 150 that provides a tough insulated enclosure for the switch and is made from a polycarbonate material. The main cover 150 may be opaque (e.g. black) or clear. When the main cover 150 is clear, the main cover 150 affords the user the unique option of intentionally leaving switch handles in the open position and replacing the main cover 150 while maintaining the provision for a meter seal when some or all switch handles 110 are in the open position. This feature allows the user to service electrical equipment while still complying with OSHA tag and lockout procedures. Users will maintain the same ease of accessibility as with the black opaque cover. A cover thumbnut 152 is provided so that a ¼" nut driver can be used to loosen & tighten the thumbnut 152. With the main cover 150 in place, a meter type lead seal can be placed through either of the cover studs of the test switch 100 to prevent unauthorized access to the test switch 100.

The upper and lower rows of connection terminals 120 are each protected by a cover 154 which is removably attached to the base 104 using integrated snaps 156 in the molded base 104. The covers 154 facilitate custom labeling and more importantly prevent accidental shorts from tools or falling objects. The covers 154 are composed of plastic and may be clear or opaque. An example of a clear plastic that may be used for the cover 154 is acrylonitrile butadiene styrene (ABS).

Figure 3:
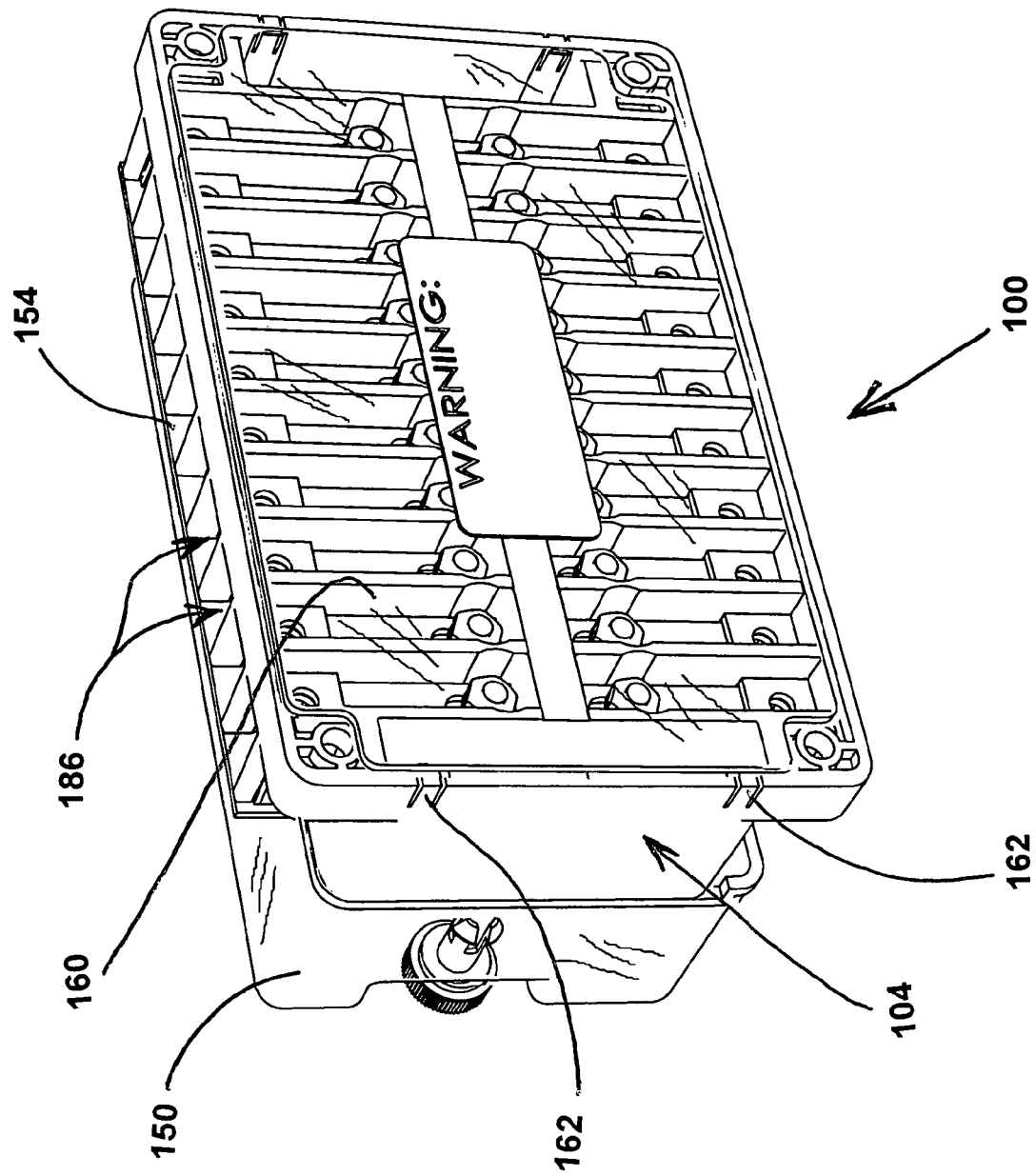
FIG. 3 is a rear perspective view of the test switch of the present invention.
Figure 4:
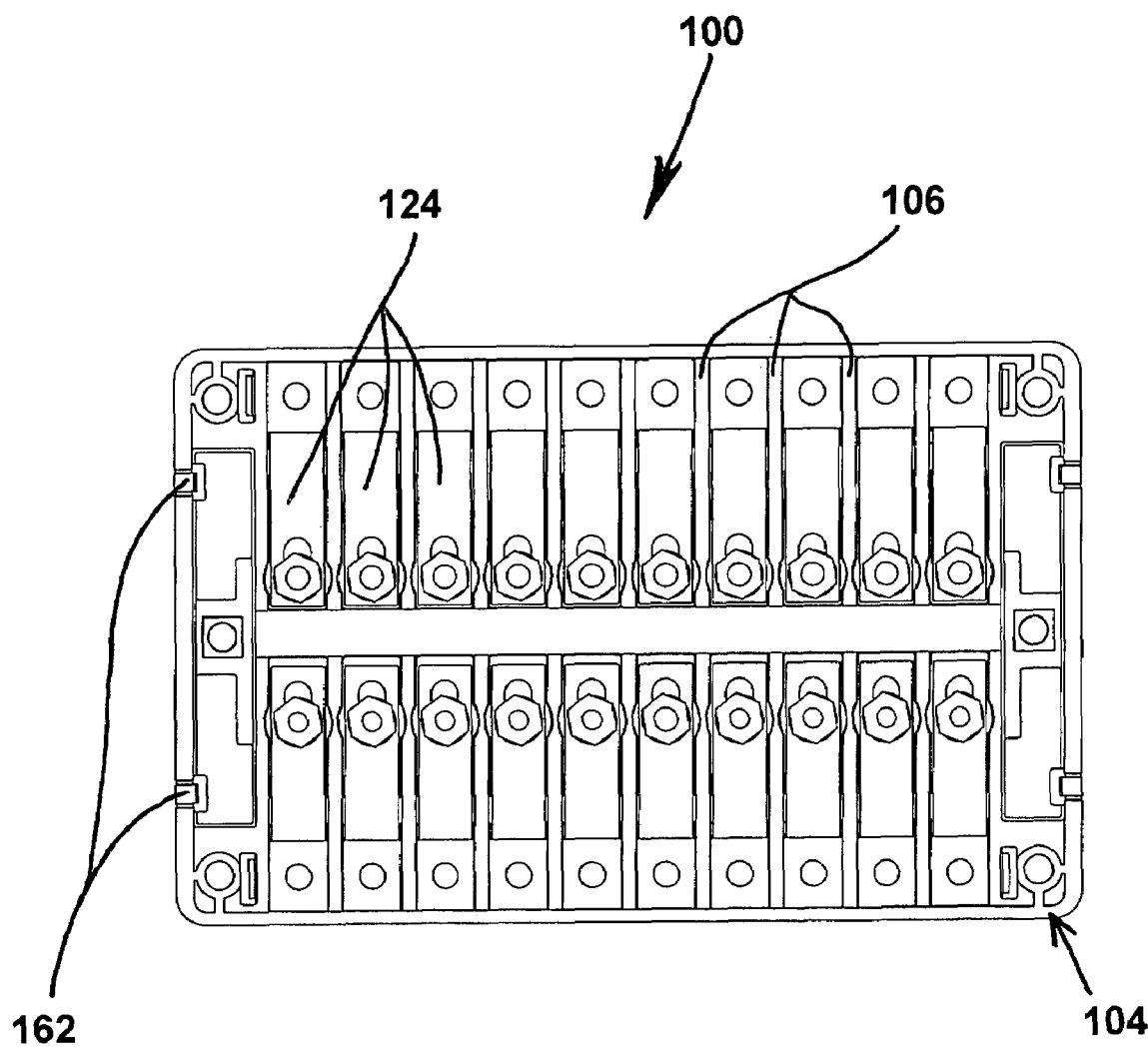
FIG. 4 is a rear plan view of the test switch of the present invention.

The rear of the test switch 100 is protected by a clear ABS cover 160 (shown in FIG. 3) which is removably attached to the base 104 using integrated snaps 162 formed in the molded base 104. Although the switch element hardware has sufficient clearance to prevent shorting, this cover 160 provides added protection between the switch element attachment hardware and the mounting panel.

In FIG. 5, the test switch 100 is shown with the main cover 150 and the upper and lower covers 154 removed to better show certain features of the present invention.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A test switch having front and rear sides and comprising:
   (a.) a base comprising:
      a row of spaced-apart upper barrier walls;
      a row of spaced-apart lower barrier walls; and
      a row of spaced-apart main barrier walls disposed between the row of upper barrier walls and the row of lower barrier walls;
   (b.) a plurality of switch units mounted to the base, each switch unit being disposed between a pair of the main barrier walls and having a handle;
   (c.) a plurality of upper terminals removably mounted to the base, each upper terminal being disposed between a pair of the upper barrier walls and connected to one of the switch units, the upper terminals being adapted for connection to wiring from the front side of the test switch;
   (d.) a plurality of lower terminals removably mounted to the base, each lower terminal being disposed between a pair of the lower barrier walls and connected to one of the switch units, the lower terminals being adapted for connection to wiring from the front side of the test switch;
   (e.) an upper cover mounted to the base and extending across the row of upper barrier walls;
   (f.) a main cover mounted to the base and disposed over the handles of the switch units;
   (g.) a lower cover mounted to the base and extending across the row of lower barrier walls; and
   (h.) wherein the upper, main and lower covers are disposed on the front side of the test switch.

2. The test switch of claim 1, wherein the upper, main and lower covers are removably mounted to the base.

3. The test switch of claim 2, wherein the upper, main and lower covers are removably mounted to the base by snaps formed in the base.

4. The test switch of claim 2, wherein the upper, main and lower covers are clear.

5. The test switch of claim 1, wherein the base is composed of plastic.

6. The test switch of claim 1, wherein at least one of the upper and lower terminals comprises a nut threadably secured to a stud.

7. The test switch of claim 6, wherein at least another one of the upper and lower terminals comprises a screw threadably disposed in an opening of a post.

8. A test switch having front and rear sides and comprising:
   (a.) a base comprising:
      a row of spaced-apart upper barrier walls;
      a row of spaced-apart lower barrier walls; and
      a row of spaced-apart main barrier walls disposed between the row of upper barrier walls and the row of lower barrier walls;
   (b.) a plurality of switch units mounted to the base, each switch unit being disposed between a pair of the main barrier walls and having a handle;
   (c.) a plurality of upper terminals removably mounted to the base, each upper terminal being disposed between a pair of the upper barrier walls and connected to one of the switch units, the upper terminals being adapted for connection to wiring from the front side of the test switch;
   (d.) a plurality of lower terminals removably mounted to the base, each lower terminal being disposed between a pair of the lower barrier walls and connected to one of the switch units, the lower terminals being adapted for connection to wiring from the front side of the test switch;
   (e.) a main cover mounted to the base and disposed over the handles of the switch units; and
   (f.) wherein at least one of the upper and lower terminals comprises a nut threadably secured to a stud, and wherein at least another one of the upper and lower terminals comprises a screw threadably disposed in an opening of a post.

9. The test switch of claim 8, further comprising
   an upper cover removably mounted to the base and extending across the row of upper barrier walls; and
   a lower cover removably mounted to the base and extending across the row of lower barrier walls.

10. The test switch of claim 9, wherein each of the upper and lower covers are clear.

* * * * *